(12) United States Patent
Pandey

(10) Patent No.: US 9,842,840 B1
(45) Date of Patent: Dec. 12, 2017

(54) TRANSISTORS AND MEMORY ARRAYS

(71) Applicant: Micron Technology, Inc., Boise, ID (US)

(72) Inventor: Deepak Chandra Pandey, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/347,623

(22) Filed: Nov. 9, 2016

(51) Int. Cl.
  *H01L 27/108* (2006.01)
  *H01L 29/08* (2006.01)
  *H01L 29/10* (2006.01)

(52) U.S. Cl.
  CPC .. *H01L 27/10826* (2013.01); *H01L 27/10879* (2013.01); *H01L 29/0847* (2013.01); *H01L 29/1033* (2013.01)

(58) Field of Classification Search
  CPC ........ H01L 27/10826; H01L 27/10879; H01L 27/0847; H01L 27/1033
  See application file for complete search history.

(56) References Cited

U.S. PATENT DOCUMENTS

| | | | |
|---|---|---|---|
| 2006/0014331 A1* | 1/2006 | Tang ................... | H01L 27/108 438/149 |
| 2006/0208300 A1* | 9/2006 | Iwanaga ......... | H01L 21/823431 257/308 |
| 2007/0222036 A1* | 9/2007 | Park .................... | H01L 27/101 257/619 |

\* cited by examiner

*Primary Examiner* — Marc Armand
*Assistant Examiner* — Sarah Salerno
(74) *Attorney, Agent, or Firm* — Wells St. John P.S.

(57) ABSTRACT

Some embodiments include a transistor having a semiconductor material with a trench extending downwardly therein. The semiconductor material has a first post region on one side of the trench and a second post region on an opposing side of the trench. The semiconductor material has a narrow fin region along the bottom of the trench and extending between the first and second post regions. Each of the first and second post regions has a first thickness and the narrow fin region has a second thickness, with the second thickness being less than the first thickness. Gate dielectric material is along sidewalls of the first and second post regions, along a top of the narrow fin region, and along side surfaces of the narrow fin region. Gate material is over the gate dielectric material. First and second source/drain regions are within the first and second post regions.

7 Claims, 15 Drawing Sheets

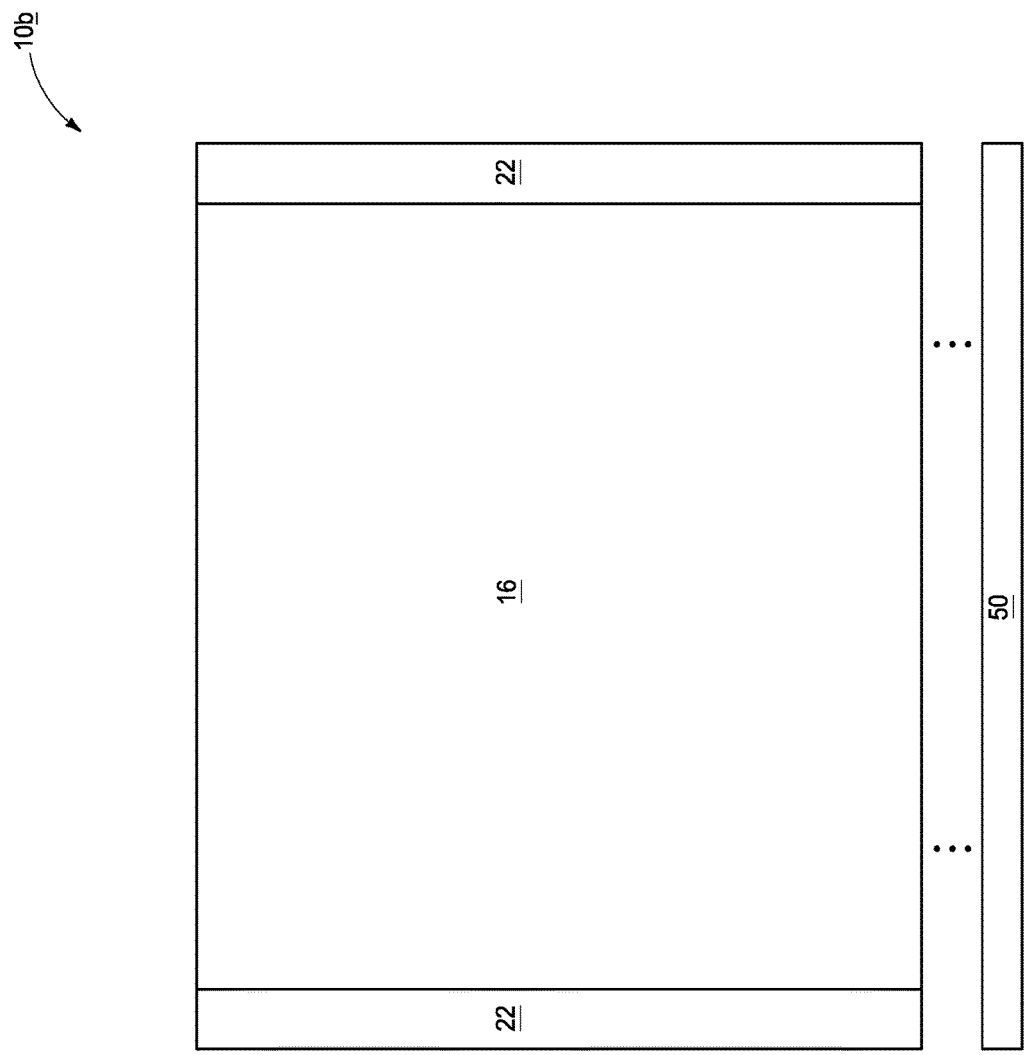

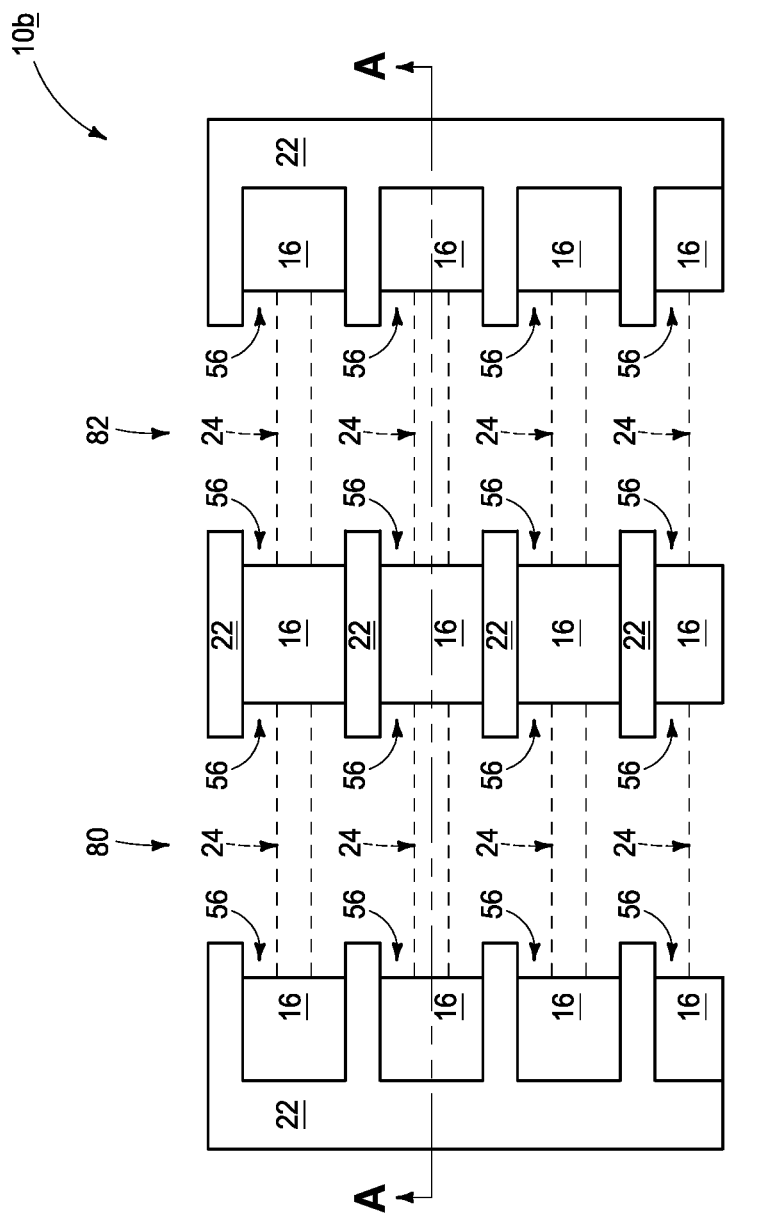

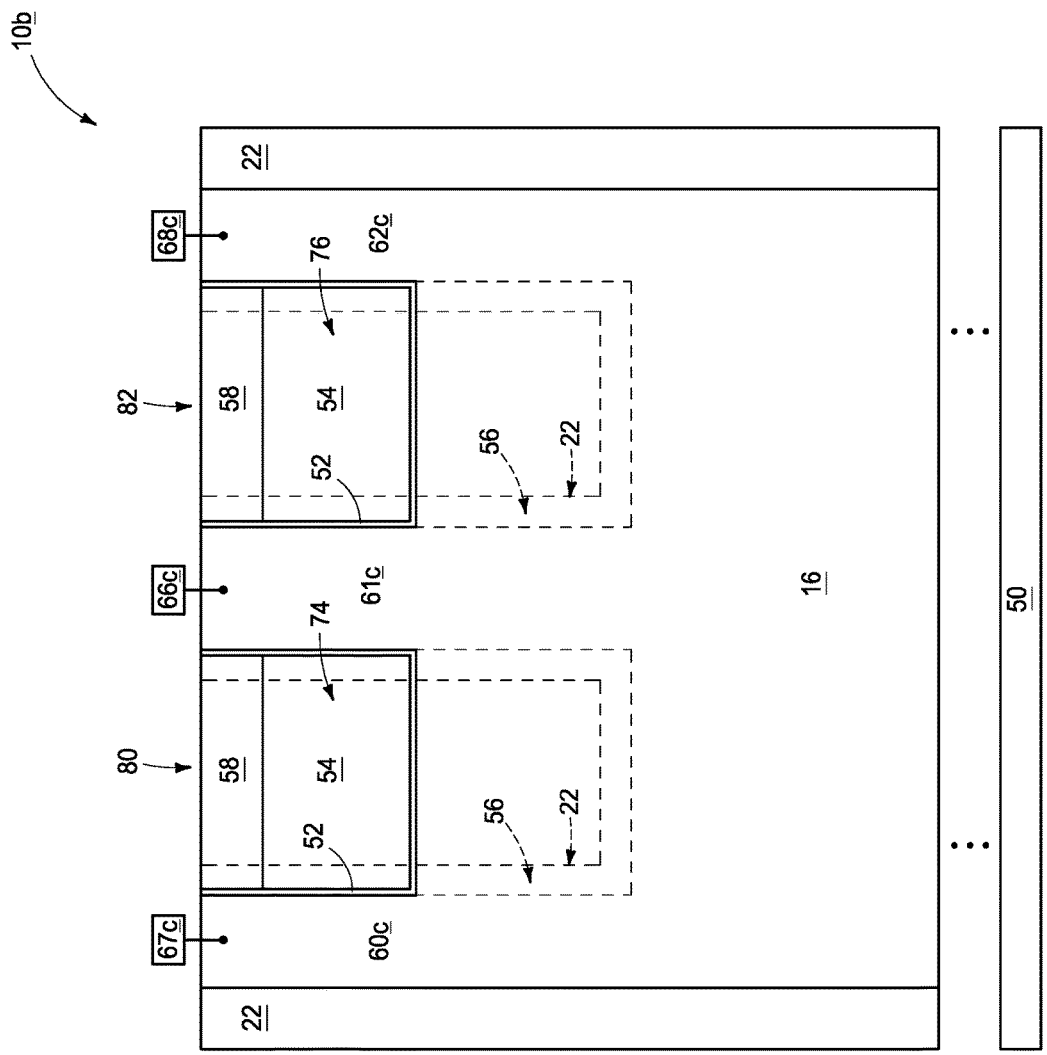

TRANSISTORS AND MEMORY ARRAYS

TECHNICAL FIELD

Transistors and memory arrays.

BACKGROUND

Transistors are commonly utilized in integrated circuits, and may have many applications throughout memory, logic, etc. For instance, transistors may be utilized in dynamic random access memory (DRAM) arrays. A memory cell of the DRAM array may comprise a transistor in combination with a capacitor. The DRAM array may comprise wordlines extending along rows of the array and bitlines extending along columns of the array, with each memory cell being uniquely addressed by the combination of a wordline and a bitline.

A continuing goal of integrated circuit fabrication is to create higher levels of integration, and accordingly to reduce size and spacing of existing components. It becomes increasingly difficult to reduce the size of transistors due to short channel effects, higher contact resistance, gate-induced drain leakage (GIDL) and other complications. Also, it becomes increasingly difficult to avoid disturbance between adjacent memory cells of a memory array, and between adjacent wordlines of a memory array.

It is desired to develop improved transistors, and to develop improved memory arrays.

BRIEF DESCRIPTION OF THE DRAWINGS

FIG. 2 is a side view, and FIGS. 3 and 4 are top-down views along the lines 3-3 and 4-4, respectively, of FIG. 2.

FIGS. 6-10 are top-down sectional views of a construction at various example process stages of an example method for forming example transistors and wordlines of an example memory array.

FIGS. 6A, 7A, 8A, 9A and 10A are cross-sectional side views along lines A-A of FIGS. 6, 7, 8, 9 and 10, respectively.

DETAILED DESCRIPTION OF THE ILLUSTRATED EMBODIMENTS

Some embodiments include new transistor configurations having narrow fin regions between thick post regions. Gate dielectric is along sidewalls of the thick post regions, across top surfaces of the narrow fin regions, and along side surfaces of the narrow fin regions. The side surfaces of the narrow fin regions are along a first plane, and the sidewalls of the thick post regions are along a second plane that intersects the first plane. Source/drain regions are within the thick post regions. Gate material is over the gate dielectric material, and extends along the sidewalls of the thick post regions, along the top surfaces of the narrow fin regions, and along the side surfaces of the narrow fin regions. Some embodiments include new integrated architectures (e.g., memory array architectures) utilizing the new transistor configurations. Example embodiments are described with reference to FIGS. 1-10.

Figure 1:
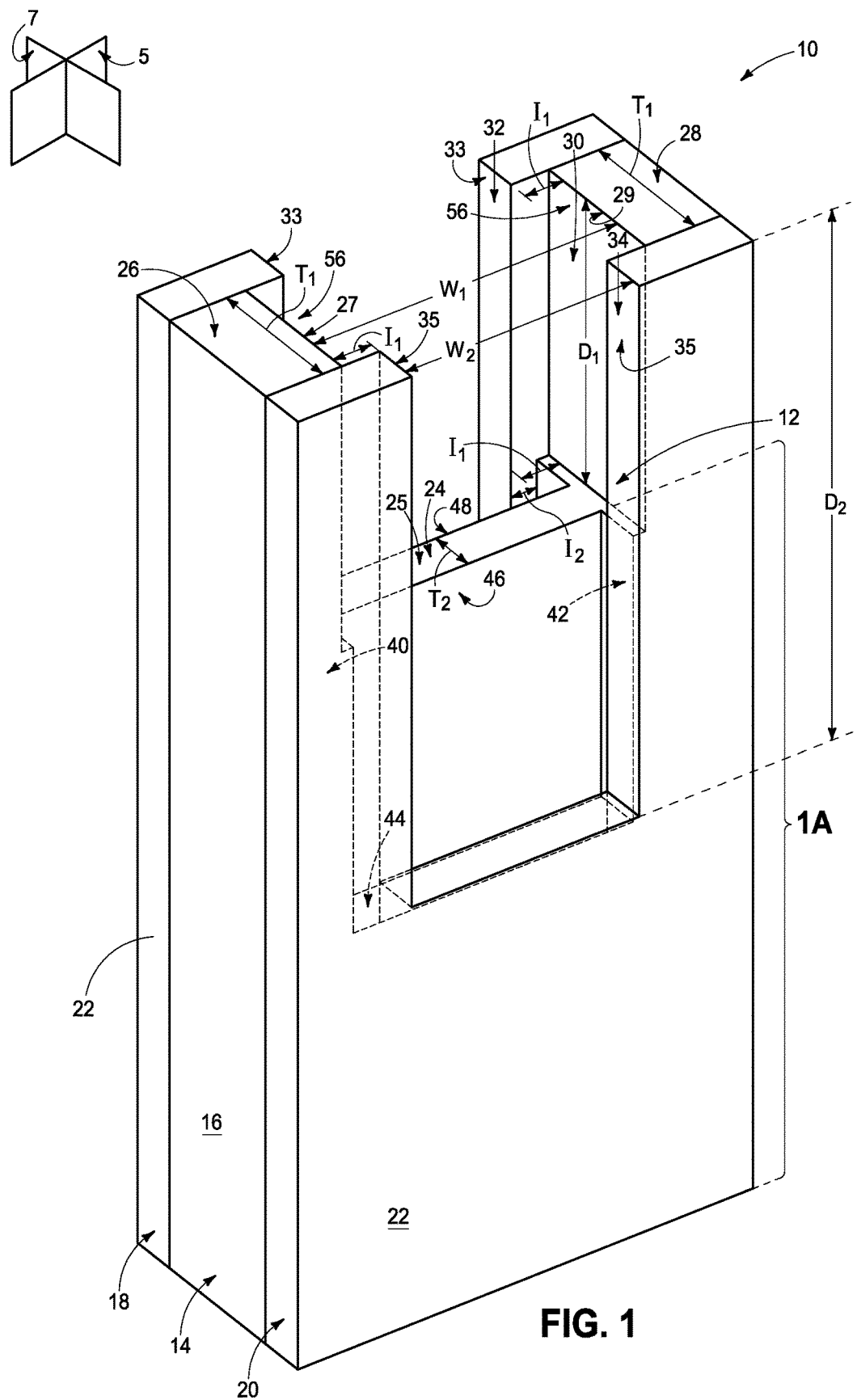
FIGS. 1 and 1A are diagrammatic three-dimensional view of a portion of an example transistor, with FIG. 1A illustrating a lower region of the structure shown in FIG. 1. The region of FIG. 1 shown in FIG. 1A is indicated in FIG. 1 with a bracket 1A.
Figure 1A:
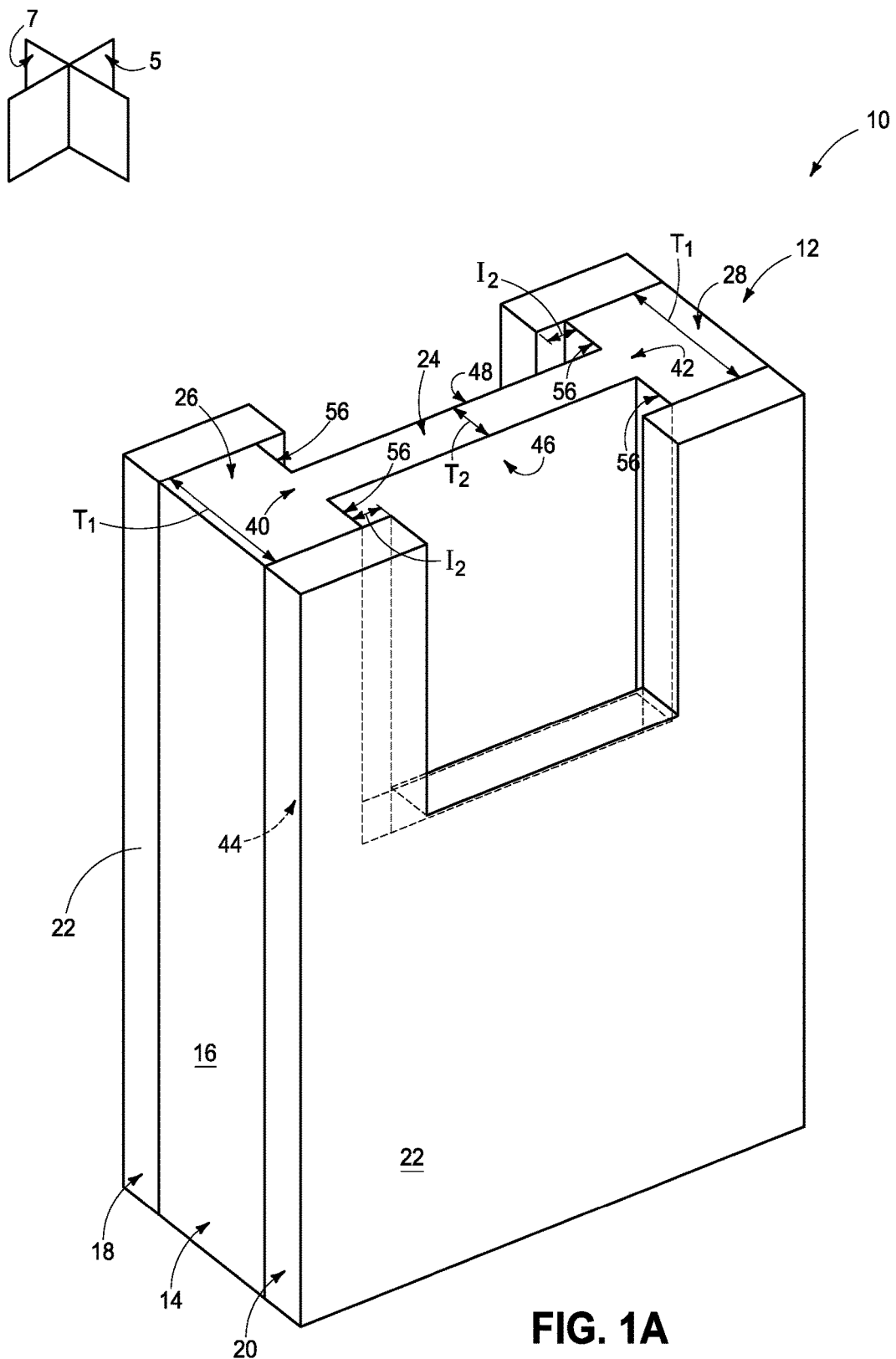

Referring to FIGS. 1 and 1A, a construction 10 comprises a portion of an example transistor 12. Gate material and gate dielectric material are not shown in FIGS. 1 and 1A in order to simplify the drawings. Rather, the focus of FIGS. 1 and 1A is on the shape of a semiconductor fin within a panel of semiconductor material, and on the relationship of such panel of semiconductor material to insulative panels on either side of the panel of semiconductor material.

The construction 10 comprises the panel 14 of semiconductor material 16. The panel 14 is sandwiched between a first insulative material panel 18 and a second insulative material panel 20. The first and second insulative material panels 18 and 20 both comprise a common insulative material 22. In other embodiments, the first and second insulative material panels 18 and 20 may comprise different insulative compositions relative to one another.

The semiconductor material 16 of panel 14 may comprise any suitable semiconductor material, including, for example, silicon, germanium, etc. In some embodiments, the semiconductor material 16 may comprise, consist essentially of, or consist of silicon.

The insulative material 22 of panels 18 and 20 may comprise any suitable insulative composition or combination of compositions; including, for example, one or more of silicon nitride, silicon dioxide, etc. In some embodiments, the insulative material 22 may comprise, consist essentially of, or consist of silicon dioxide.

The semiconductor material 16 is configured to comprise a fin region 24 between a pair of post regions 26 and 28. The post region 26 may be referred to as a first post region, and the post region 28 may be referred to as a second post region. Some portions of the post regions 26/28 and fin region 24 are shown in dashed-line (phantom) view to indicate that they are hidden by other structures in the views of FIGS. 1 and 1A.

The post regions 26/28 are wider than the fin region 24. Specifically, the post regions 26/28 have first thicknesses $T_1$ and the fin region 24 has a second thickness $T_2$; with the second thickness $T_2$ being less than the first thickness $T_1$. The first thickness $T_1$ may be of any suitable dimension; and in some embodiments the first thickness $T_1$ may be within a range of from about 5 nanometers (nm) to about 50 nm. The second thickness $T_2$ may be of any suitable dimension; and in some embodiments the second thickness $T_2$ may be within a range of from about 2 nm to about 20 nm. In some embodiments, the second thickness $T_2$ may be no more than about 30% of the first thickness $T_1$, no more than about 20% of the first thickness $T_1$, no more than about 15% of the first thickness $T_1$, no more than about 10% of the first thickness $T_1$, no more than about 5% of the first thickness $T_1$, etc. In some embodiments, the post regions 26/28 may be referred to as "thick" post regions and the fin region 24 may be referred to as a "narrow" fin region to emphasize that the fin region 24 is narrower than the post regions 26/28.

The semiconductor material 16 of panel 14 has a trench 30 extending downwardly therein. The first post region 26 is on one side of the trench 30, and the second post region 28 is on an opposing side of the trench 30. More specifically, the first post region 26 has a sidewall 27 extending along one side of the trench 30, and the second post region 28 has a sidewall 29 extending along a second side of the trench 30. An upper surface 25 of the fin region 24 may be considered to be a bottom of the trench 30; or, in other words, the bottom of the trench 30 may be considered to extend along the upper surface 25 of fin region 24.

A trench 32 extends downwardly into the insulative material 22 of the first insulative panel 18, and a trench 34 extends downwardly into the insulative material 22 of the second insulative panel 20. In some embodiments, the trenches 32 and 34 may be referred to as a first trench and a second trench, and the trench 30 may be referred to as a central trench between the first and second trenches 32/34. The first and second trenches 32/34 may be substantially identical to one another in size and shape (with the term "substantially identical" meaning identical to within reasonable tolerances of fabrication and measurement). The second trench 34 is more visible in the views of FIGS. 1 and 1A than is the first trench 32, and accordingly various dimensions of the first and second trenches 32/34 will be illustrated only relative to the second trench 34 in FIGS. 1 and 1A.

The trenches 30/32/34 are all illustrated to have relatively vertical sidewalls in the embodiment of FIGS. 1 and 1A. In other embodiments, the sidewalls may be slanted from vertical, and may or may not be straight, depending, for example, on the conditions utilized to form the trenches 30/32/34, the depths of trenches 30/32/34, etc.

The central trench 30 extends to a first depth $D_1$ and the trenches 32/34 each extend to a second depth $D_2$; with the second depth $D_2$ being greater than the first depth $D_1$. The second depth $D_2$ may be greater than the first depth $D_1$ by any suitable amount. In some embodiments, the first depth $D_1$ may be less than about 70% of the second depth $D_2$, may be less than about 50% of the second depth $D_2$, etc.

The central trench 30 has a first width $W_1$, and each of the trenches 32/34 has a second width $W_2$; with the second width $W_2$ being less than the first width $W_1$. The second width $W_2$ may be less than the first width $W_1$ by any suitable amount. In some embodiments, the edges of trench 30 are inset relative to edges of trenches 32/34 by a first inset distance $I_1$. Such first inset distance, $I_1$, may be at least about 1 nm, at least about 2 nm, etc. In some embodiments, trenches 32 and 34 may be considered to have downwardly-extending edges 33 and 35, respectively; and the sidewall edges 27/29 may be considered to be downwardly-extending edges of the thick post regions 26/28. The sidewall edges 27/29 may be inset relative to the downwardly-extending edges 33/35 by the first inset distance $I_1$. The semiconductor material 16 may be inset by a second inset distance $I_2$ along sides 40/42 of the narrow fin region 24, and also along a bottom 44 of the narrow fin region 24 (the inset along the sides 40/42 and bottom 44 of the fin region is more clearly illustrated along a cross-sectional side view of FIG. 2). In some embodiments, a part of the narrow fin region 24 which is located above the bottom 44 and inset along the side by the amount $I_1$ in FIG. 2 may be referred to as an "upper" part, and another part of the narrow fin region 24 which is between the bottom 44 and the upper part (a portion of the fin region 24 inset along the side by the amount $I_2$ in FIG. 2) may be referred to as an "lower" part. A side surface of fin region 24 can be seen in FIG. 2 to be uneven at a connection portion between the upper and lower parts (i.e., transitions from $I_2$ to $I_1$ at such connection portion).

The inset distance $I_2$ may be about the same as the inset distance $I_1$ in some embodiments, or may be substantially different from the inset distance $I_1$ in other embodiments. For instance, in the shown embodiment, the inset distance $I_2$ is about one-half of the inset distance $I_1$. The first and second inset distances $I_1$ and $I_2$ may be together considered to define recesses 56 in some embodiments. Such recesses may have upper regions with depths corresponding to $I_1$ and lower regions with depths corresponding to $I_2$. In some embodiments, the second inset region $I_2$ is at least about 0.5 nm, at least about 1 nm, at least about 2 nm, etc.; and the first inset region $I_1$ is at least as large as the second inset region $I_2$.

The fin region 24 has opposing side surfaces 46 and 48, with such side surfaces 46/48 being exposed within lower regions of the first and second trenches 32/34. In some embodiments, the surfaces 46/48 of fin region 24 may be considered to extend along a first plane 5 (shown adjacent the structure 10 of FIGS. 1 and 1A), and the sidewall surfaces 27/29 of post regions 26/28 may be considered to extend along a second plane 7 (shown adjacent the structure 10 of FIGS. 1 and 1A) which intersects the first plane 5. In the illustrated embodiment, the first and second planes 5 and 7 are substantially orthogonal to one another; with the term "substantially orthogonal" meaning orthogonal to within reasonable tolerances of fabrication and measurement.

The illustrated fin region 24 has "T"-shaped top regions of top surface 25 adjacent post regions 26 and 28 due to the second inset distance $I_2$ being less than the first inset distance $I_1$. In other embodiments, the first and second inset distances $I_1/I_2$ may have other relationships, and accordingly top surface 25 may have other configurations than the shown configuration.

The patterned semiconductor material 16 of FIGS. 1 and 1A (i.e., the configuration having the narrow fin region 24 between the thick post regions 26/28) may be incorporated into a transistor by providing gate dielectric material along exposed surfaces of the narrow fin region 24 and thick post regions 26/28; and then forming gate material over the gate dielectric material. In some embodiments, such transistor may be incorporated into a memory array, such as a DRAM array.

Figure 2:
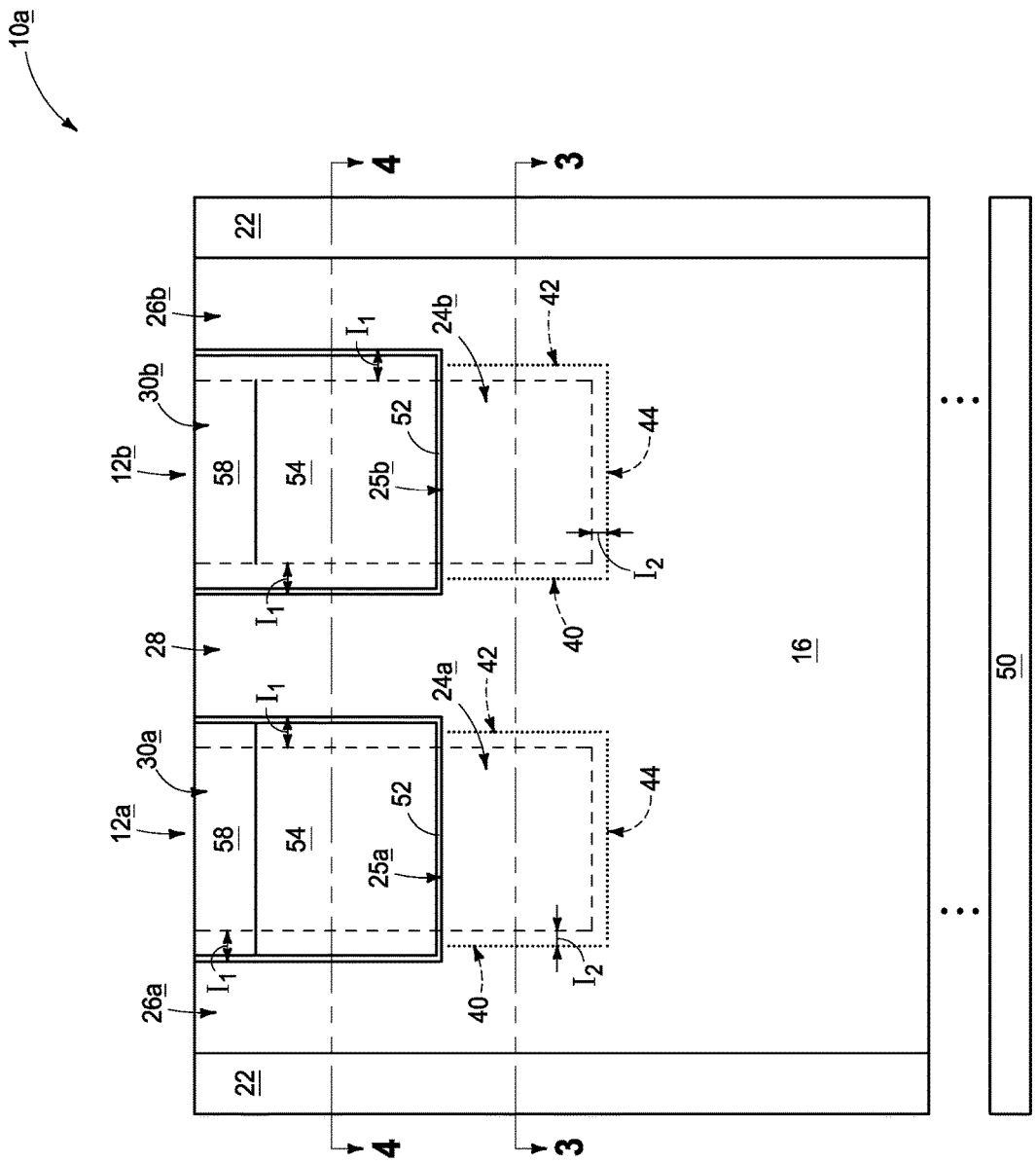
FIGS. 2-4 are cross-sectional views of a pair of example transistors that are adjacent to one another.
Figure 3:
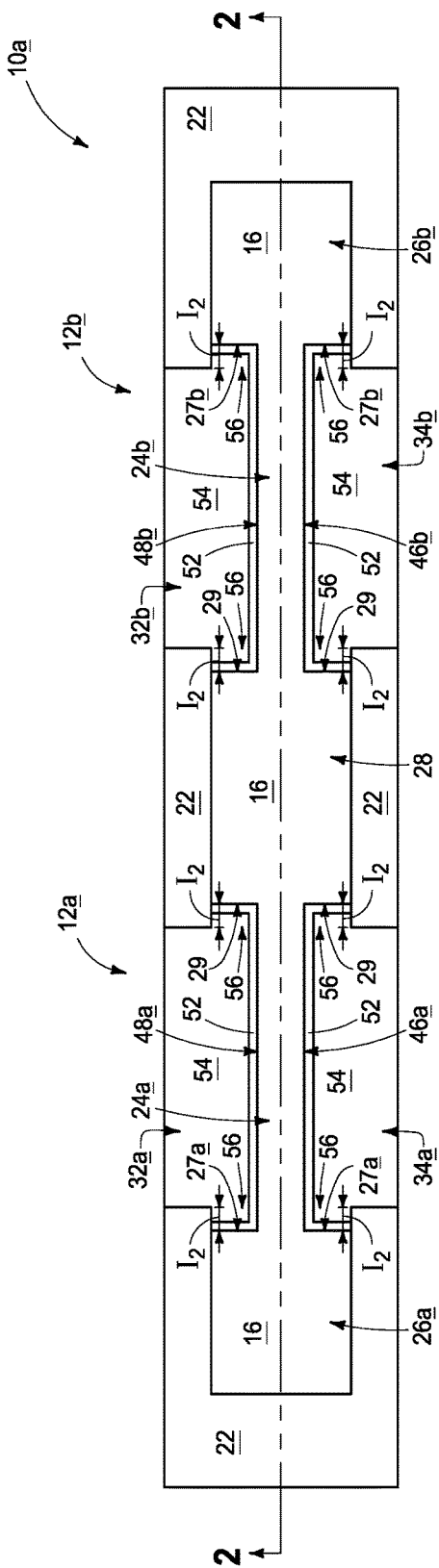
Figure 4:
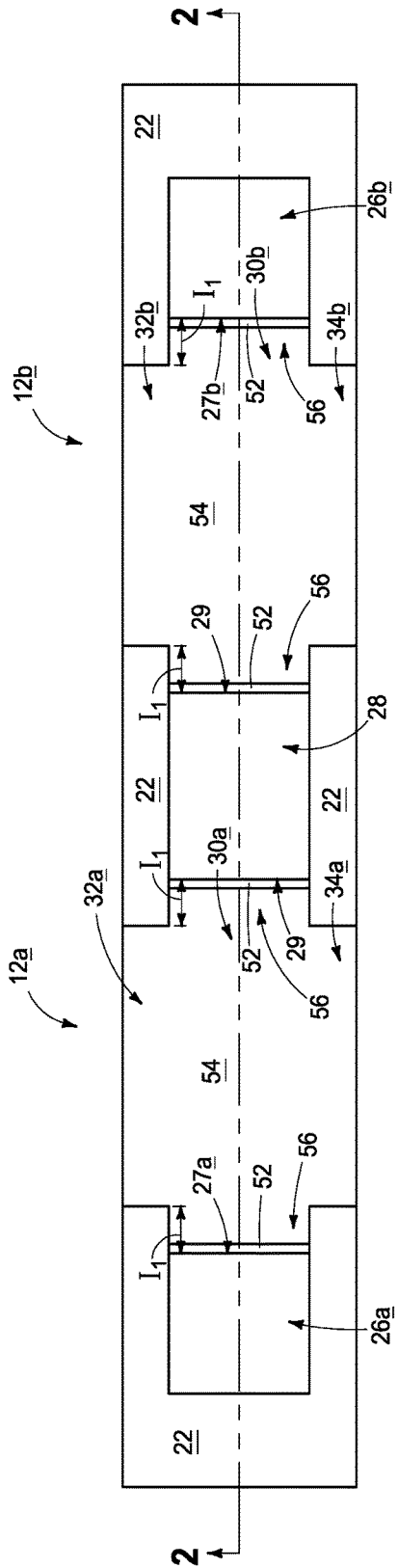

FIGS. 2-4 show a portion of a construction 10a comprising paired transistors 12a and 12b. The transistors 12a/12b are identical to the transistor 12 described above with reference to FIG. 1. In some embodiments, the transistors 12a/12b may be considered to be finFETs in that they are field effect transistors (FETS) comprising fins of semiconductor material.

The construction 10a of FIGS. 2-4 comprises semiconductor material 16 supported by a base 50. The base 50 may comprise semiconductor material; and may, for example, comprise, consist essentially of, or consist of monocrystalline silicon. The base 50 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications the base 50 may correspond to a semiconductor substrate containing one or more materials associated with integrated circuit fabrication. Such materials may include, for example, one or more of refractory metal materials, barrier materials, diffusion materials, insulator materials, etc. The base 50 is shown to be spaced from the semiconductor material 16 by a gap in the embodiment of FIGS. 2-4. Such gap is provided to indicate that there may be other materials or structures between the base 50 and the semiconductor material 16 in some embodiments. In other embodiments, the semiconductor material 16 may be provided directly against the base 50, and may comprise a common semiconductor material as the base 50.

The transistor 12a comprises a narrow fin region 24a between a thick post region 26a and another thick post region 28; and the transistor 12b comprises a narrow fin region 24b between a thick post region 26b and the thick post region 28. Notably, the thick post region 28 is shared between the adjacent transistors 12a and 12b. Dotted lines are utilized in FIG. 2 to illustrate approximate boundaries of the fin regions 24a/24b, and to thereby emphasize the locations of the fin regions 24a/24b. However, it is to be understood that the fin regions 24a/24b are generally fin-shaped regions formed within semiconductor material 16, and accordingly merge with the bulk of semiconductor material 16.

The narrow fin region 24a comprises an upper surface 25a and side surfaces 46a/48a. Similarly, the narrow fin region 24b comprises an upper surface 25b and side surfaces 46b/48b.

The thick post regions 26a and 26b comprise sidewalls 27a and 27b, respectively; and the thick post region 28 comprises sidewalls 29.

Gate dielectric material 52 is along the upper surfaces 25a/25b of fin regions 24a/24b, along the side surfaces 46a/46b/48a/48b of fin regions 24a/24b, and along the sidewalls 27a/27b/29 of post regions 26a/26b/28.

Gate material 54 is over the gate dielectric material 52, and extends along the sidewalls 27a/27b/29 of post regions 26a/26b/28, the top surfaces 25a/25b of fin regions 24a/24b, and along the side surfaces 46a/46b/48a/48b of the fin regions 24a/24b.

The inset distances $I_1$ and $I_2$ are shown in FIGS. 2-4 to illustrate that the gate dielectric material 52 and gate material 54 may extend into the recesses 56 defined by the inset distances. Also, the trenches 30a/32a/34a/30b/32/b/34b are shown in FIGS. 2-4 (with such trenches being analogous to the trenches 30/32/34 shown in FIGS. 1 and 1A) to indicate that the gate dielectric material 52 and gate material 54 may extend within the trenches 32 and 34 extending into the insulative material 22. The gate dielectric material 52 and gate material 54 along sidewall surfaces 46a/46b/48a/48b of narrow fin regions 24a/24b are within lower portions of the trenches 32a/32b/34a/34b extending into the insulative material 22, as shown in FIG. 3.

An electrically insulative capping material 58 is provided over the gate material 54 in the embodiment of FIGS. 2-4. Such electrically insulative capping material 58 may comprise any suitable composition or combination of compositions; including, for example, one or more of silicon nitride, silicon dioxide, etc.

Figure 5:
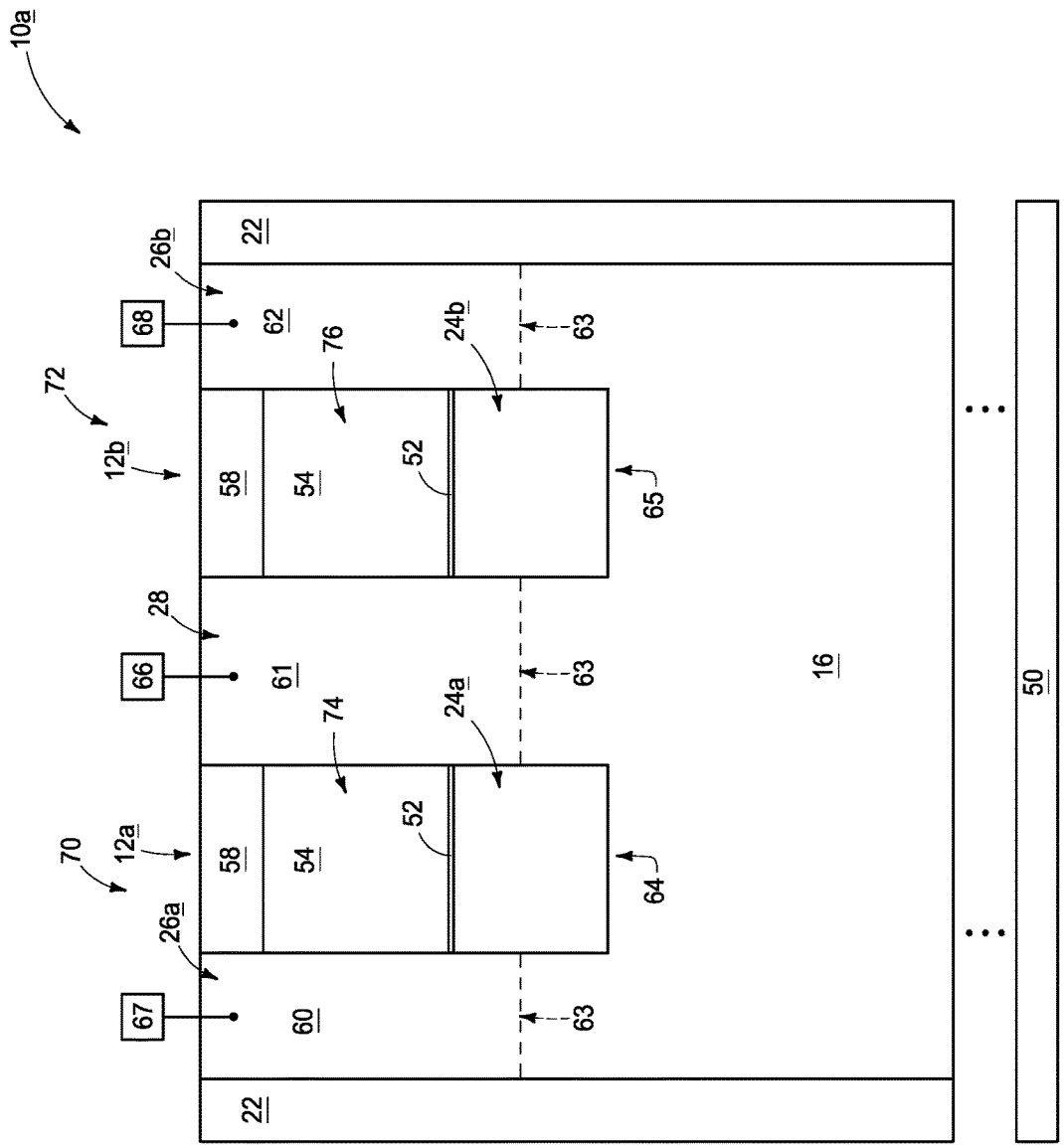
FIG. 5 is a cross-sectional side view of a portion of an example memory array comprising example transistors.

Source/drain regions may be provided within the thick post regions 26a/26b/28. FIG. 5 shows the construction 10a having source/drain regions 60-62 formed within the post regions 26a/28/26b. The source/drain regions 60-62 may correspond to conductively-doped regions formed within semiconductor material 16, and dashed-lines 63 are provided to diagrammatically illustrate approximate lower boundaries of the conductively-doped regions. The source/drain regions 60-62 may be majority n-type doped in some embodiments, and may be majority p-type doped in other embodiments.

The transistor 12a comprises a first source/drain region 60 gatedly coupled with a second source/drain region 61 through a channel region 64 extending between the first and second source/drain regions 60 and 61; and the transistor 12b comprises a first source/drain region 62 gatedly coupled with the second source/drain region 61 through a channel region 65 extending between the first and second source/drain regions 62 and 61. Notably, the source/drain region 61 is shared between the transistors 12a and 12b. In the illustrated embodiment, a bitline 66 is electrically coupled with the shared source/drain region 61. Charge-storage devices 67 and 68 are electrically coupled with the source/drain regions 60 and 62. The charge-storage devices 67 and 68 may correspond to any devices suitable for reversibly storing charge, including, for example, capacitors. The transistor 12a and charge-storage device 67 may be comprised by a first memory cell 70, and the transistor 12b and charge-storage device 68 may be comprised by a second memory cell 72. The gate material 54 extending through transistor 12a may be part of a first wordline 74, and the gate material 54 extending through the transistor 12b may be part of a second wordline 76. The first memory cell 70 may be addressed utilizing the wordline 74 in combination with the bitline 66, and the second memory cell 72 may be addressed utilizing the wordline 76 in combination with the bitline 66.

The memory cells 70 and 72 may be part of a DRAM array. The transistors 12a/12b may be representative of a large number of substantially identical memory cells within such array. The bitline 66 may be representative of a large number of bitlines that extend along columns of the memory array, and the wordlines 74/76 may be representative of a large number of wordlines that extend along rows of the memory array. In some embodiments, the bitlines (e.g., 66) may extend substantially orthogonally to the wordlines (e.g., 74/76) across the memory array.

In the shown embodiment, the gate material 54 is electrically coupled to the wordlines 74/76 by means of the gate material 54 being comprised by the wordlines 74/76. In other embodiments, at least some of the gate material 54 may not be comprised by the wordlines, and may be instead electrically coupled to the wordlines through intervening conductive structures.

The transistors 12/12a/12b of FIGS. 1-5 may be fabricated with any suitable processing. Example processing is described with reference to FIGS. 6-10.

Figure 6:
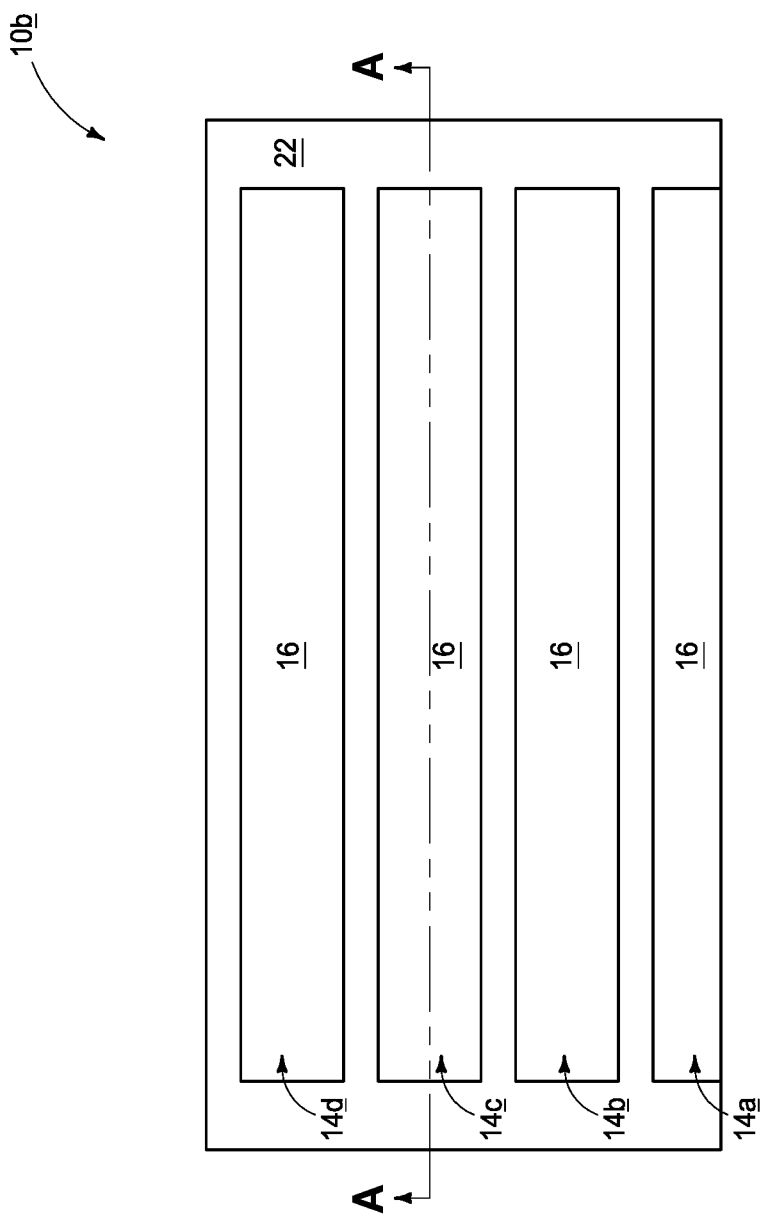

Referring to FIGS. 6 and 6A, a construction 10b is shown to comprise panels 14a-d of semiconductor material 16, with the panels being spaced from one another by intervening regions of the insulative material 22.

Figure 7:
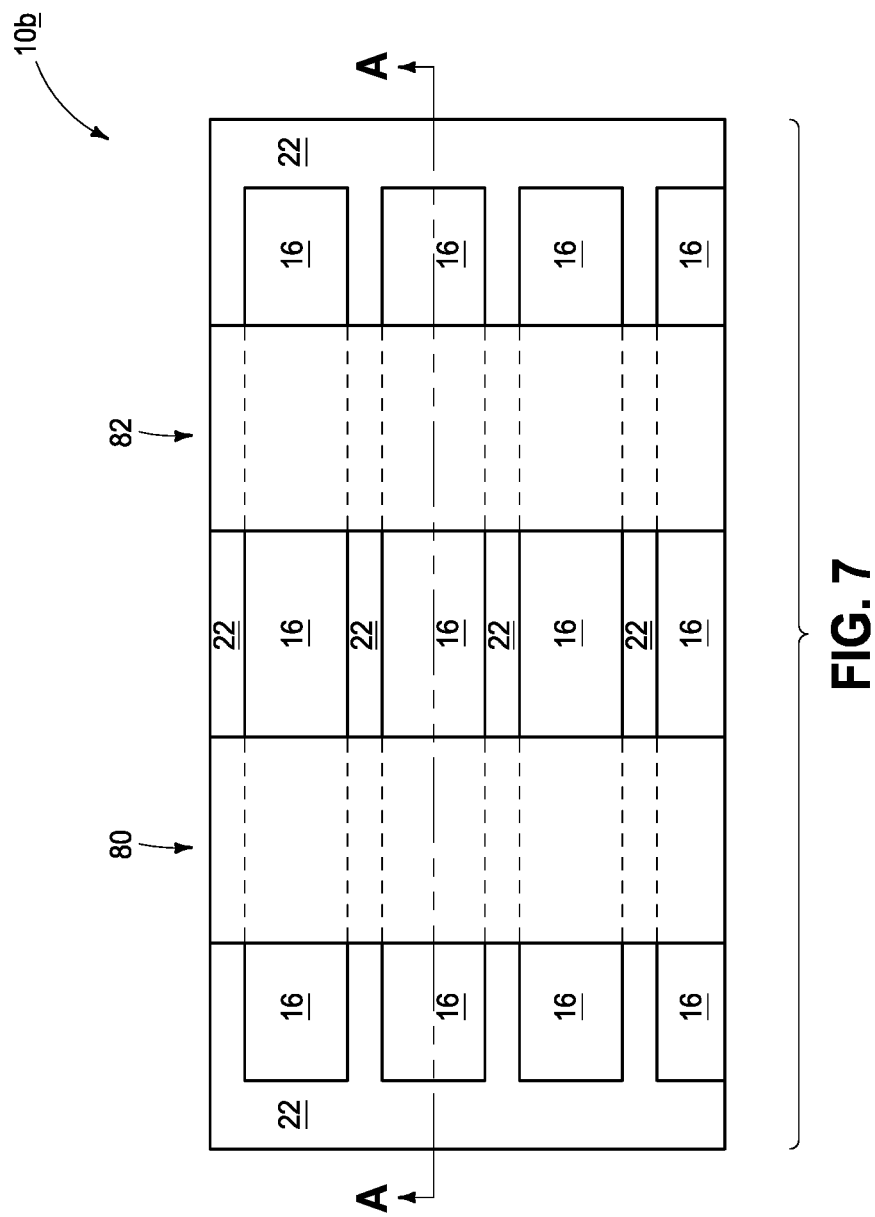
Figure 7A:
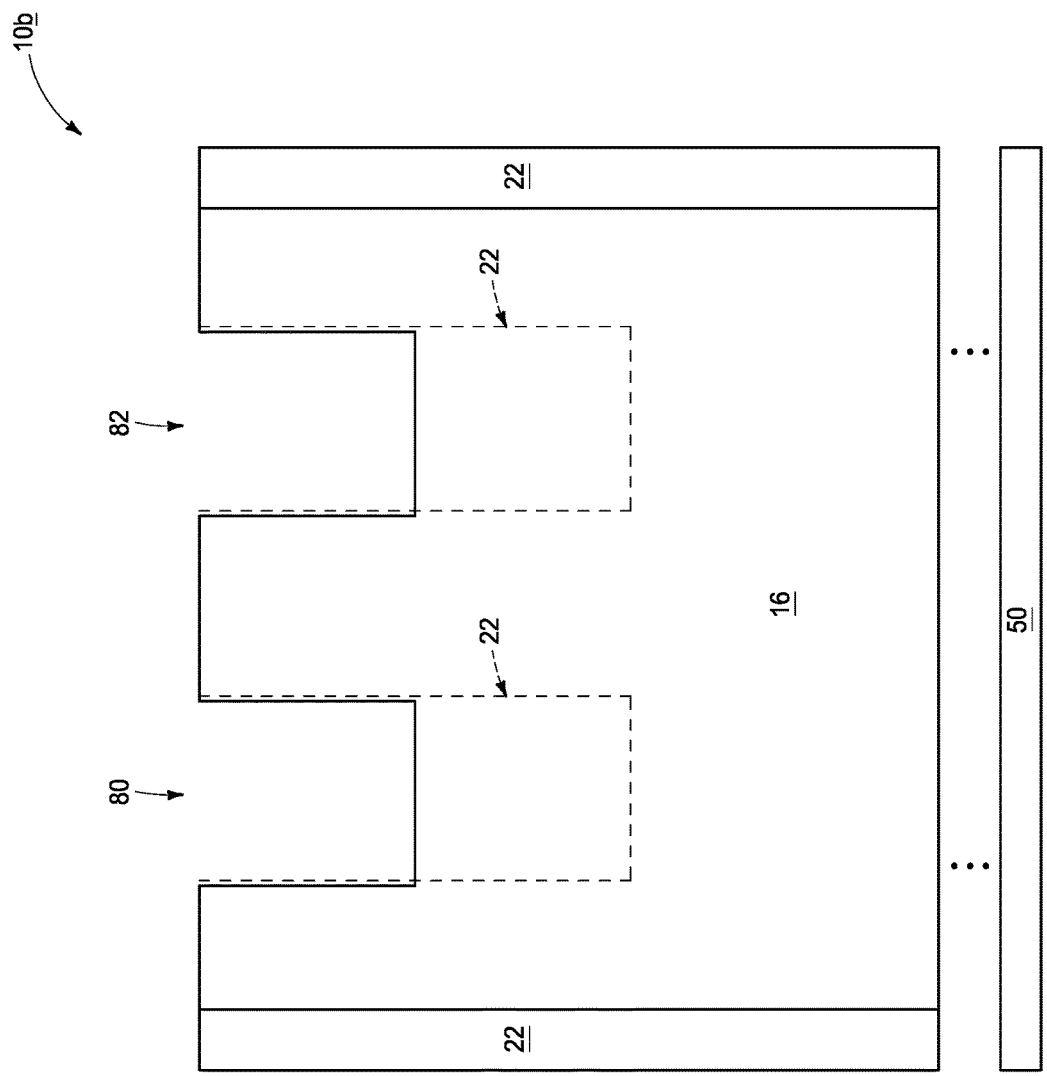

Referring to FIGS. 7 and 7A, trenches 80 and 82 are formed to extend into semiconductor material 16 and insulative material 22. The trenches are deeper within the insulative material 22 then within the semiconductor material 16. Portions of trenches 80 and 82 within material 22 are shown with dashed-lines relative to the cross-section of FIG. 7A to indicate that the material 22 is in front of the plane of the view of FIG. 7A. The illustrated portions of trenches 80 and 82 within the material 22 in FIG. 7A are shown to be deeper than the portions of trenches 80 and 82 within the semiconductor material 16. Dashed-lines are utilized in the top-down view of FIG. 7 to show regions of semiconductor material 16 at bottoms of the trenches 80 and 82, and to diagrammatically illustrate that there is a change in depth between the material 16 at the bottoms of the trenches 80 and 82 and the material 22 at the bottoms of the trenches 80 and 82.

The trenches 80 and 82 may be formed with any suitable processing. For instance, a patterned photoresist mask (not shown) may be utilized to define locations of the trenches 80 and 82, and then the trenches may be etched into the materials 22 and 16 with one or more suitable etches.

Figure 8A:
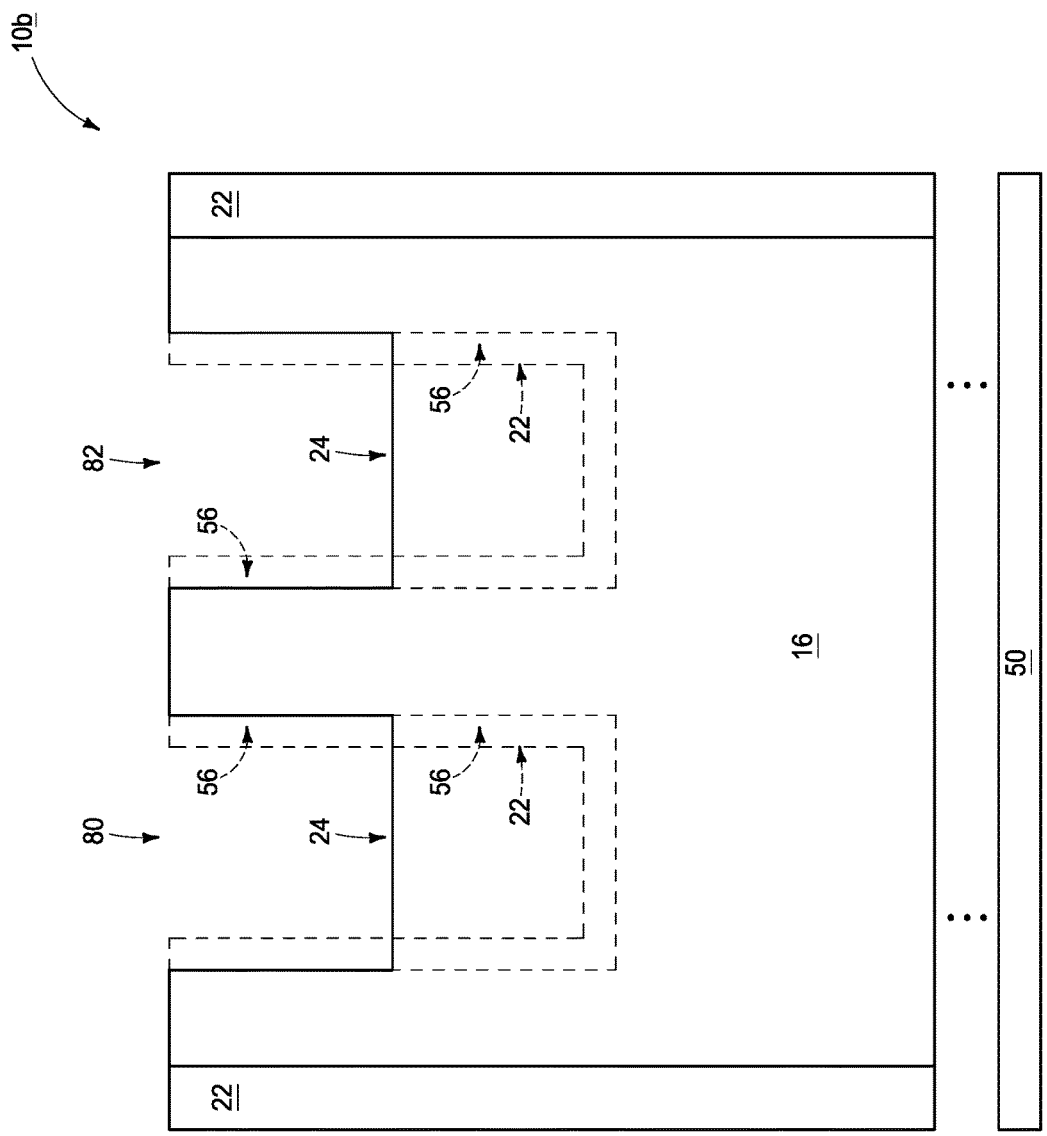

Referring to FIGS. 8 and 8A, semiconductor material 16 is selectively etched relative to insulative material 22. The etching of semiconductor material 16 forms the narrow fin region 24 and the recesses 56. Portions of trenches 80 and 82 within material 22 are diagrammatically illustrated with dashed-lines relative to the cross-section of FIG. 8A to indicate that the material 22 is in front of the plane of the view of FIG. 8A; and the recesses 56 are also diagrammatically illustrated in the view of FIG. 8A. The embodiment of FIGS. 8 and 8A shows the recesses 56 having a common inset distance (for instance the distance $I_1$ of FIGS. 1-4) instead of having two inset distances (for instance, the distances $I_1$ and $I_2$ of FIGS. 1-4). Such is utilized to simplify the drawings and descriptions of the example method. Etching conditions may be chosen to form a configuration analogous to that of FIGS. 1-4 in other embodiments.

The etching of FIGS. 8 and 8A includes an isotropic etch of semiconductor material 16, which is a different etch than conventional pre-cleaning of silicon surfaces to remove silicon dioxide in preparation for deposition of gate dielectric (e.g., gate oxide). However, in some embodiments the etching of FIGS. 8 and 8A may include pre-cleaning of silicon surfaces (e.g., removal of silicon dioxide) in addition to the isotropic etch of silicon material 16.

Figure 9:
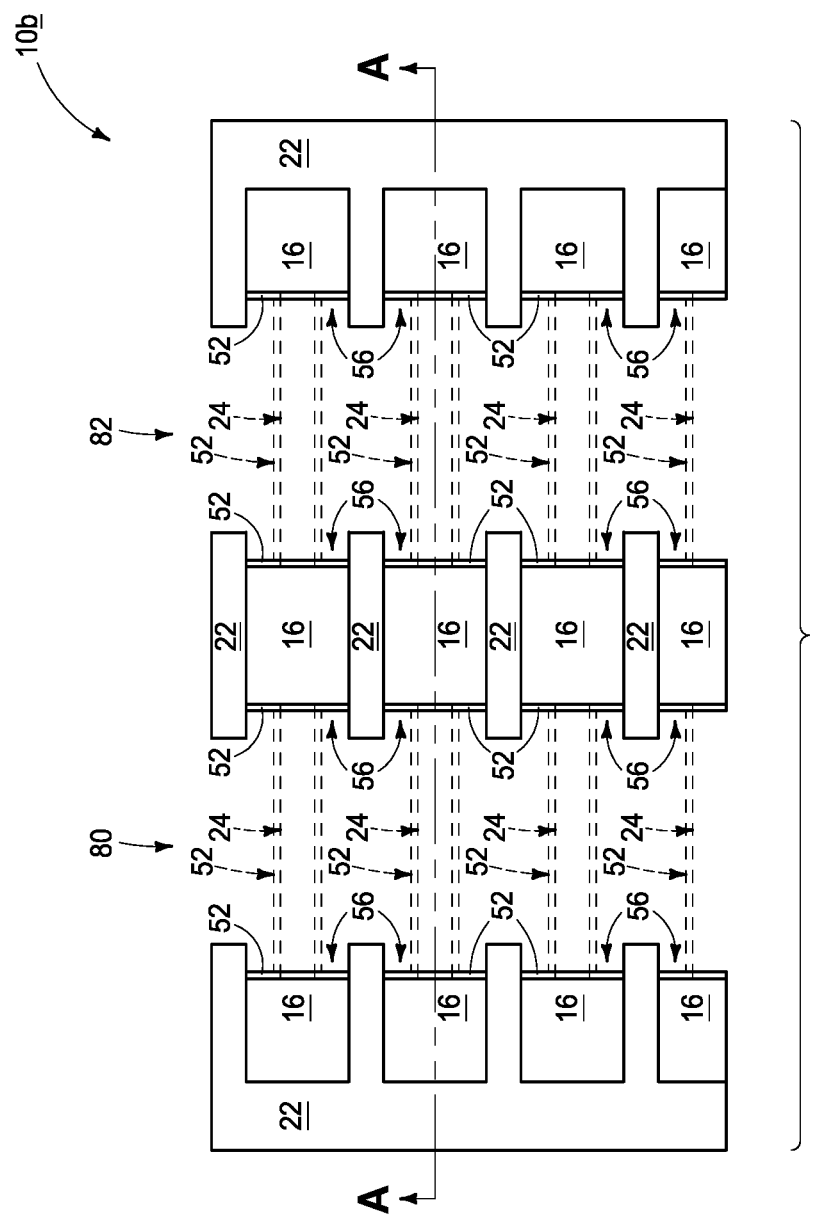
Figure 9A:
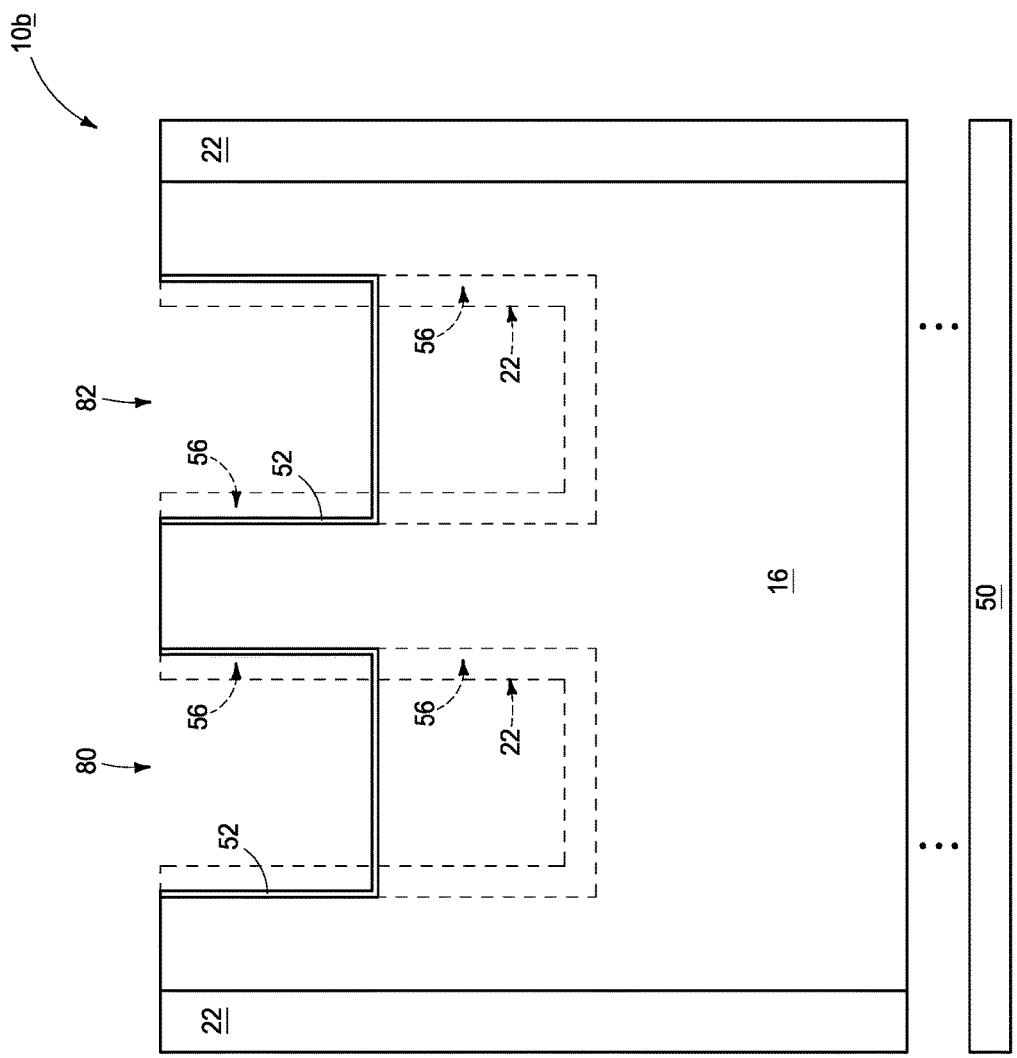

Referring to FIGS. 9 and 9A, gate oxide 52 is formed along exposed surfaces of semiconductor material 16. The gate oxide 52 may be formed utilizing any suitable processing. For instance, if semiconductor material 16 comprises silicon, the gate oxide 52 may correspond to silicon dioxide oxidatively grown along a surface of the semiconductor material 16. In some embodiments, such oxidative growth may be accomplished utilizing in- situ steam generation (ISSG).

The gate oxide 52 extends into the recesses 56.

Figure 10:
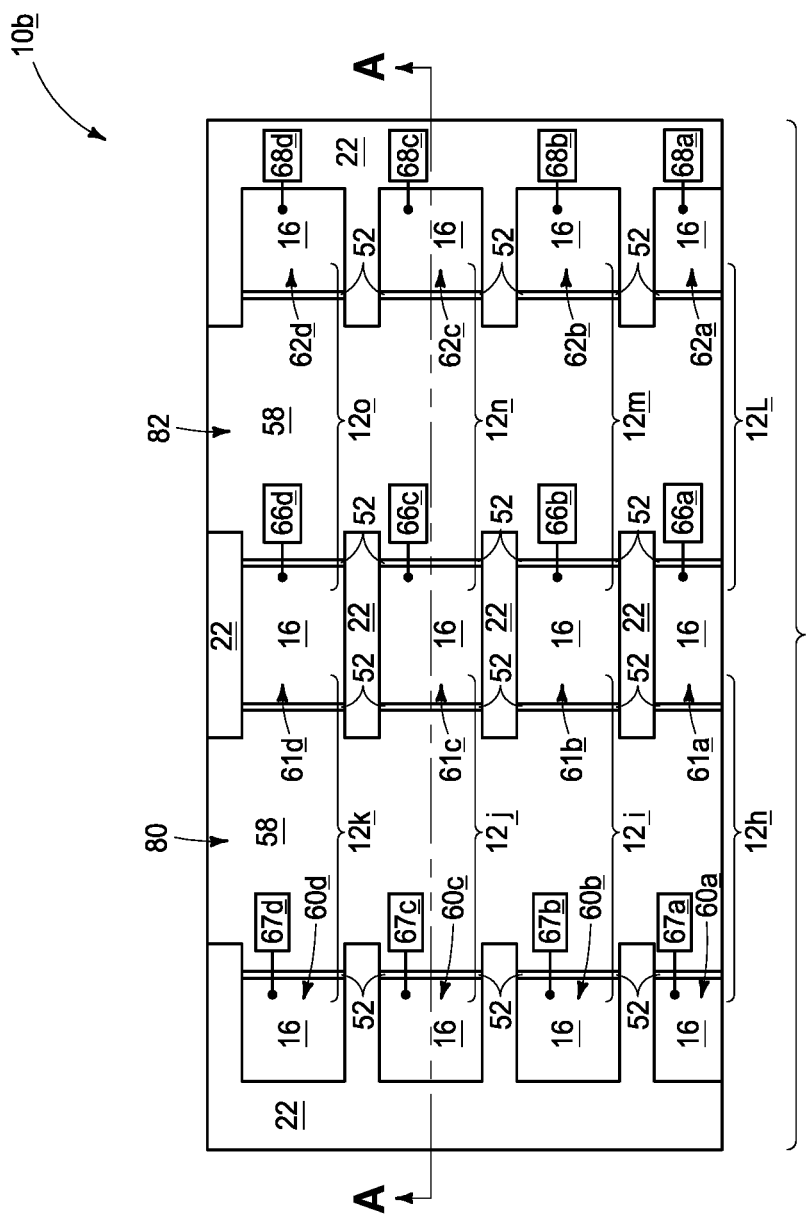

Referring to FIGS. 10 and 10A, gate material 54 and insulative capping material 58 are formed within the trenches 80 and 82. The gate material 54 within trench 80 may be the wordline 74, and the gate material 54 within the trench 82 may be the wordline 76. Source/drain regions 60a-d, 61a-d and 62a-d may be formed within posts of semiconductor material 16 along trenches 80 and 82. Such source/drain regions may be incorporated into a plurality of transistors (i.e., finFETs) 12h-o. The transistors may be incorporated into memory cells of a DRAM array by providing bitlines 66a-d and charge-storage devices 67a-d/68a-d (analogous to the bitline 66 and charge-storage devices 67/68 of FIG. 5).

The transistors described herein may be utilized in memory (as shown in some of the example embodiments), or in any other suitable applications (such as, for example, logic).

In some embodiments, the transistors described herein may be have reduced short channel effects and/or reduced gate-induced drain leakage (GIDL) as compared to conventional transistors of similar dimension. In some embodiments, the utilization of the transistors and wordlines described herein may reduce or eliminate disturbance between adjacent memory cells of a memory array, and between adjacent wordlines of a memory array; as compared to conventional memory arrays comprising conventional transistors and wordlines.

The structures and arrays discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

Both of the terms "dielectric" and "electrically insulative" may be utilized to describe materials having insulative electrical properties. The terms are considered synonymous in this disclosure. The utilization of the term "dielectric" in some instances, and the term "electrically insulative" in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections (unless indicated otherwise) in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present.

Some embodiments include a transistor having a semiconductor material with a first thick post region and a second thick post region. The semiconductor material has a narrow fin region extending between the first and second thick post regions. Each of the first and second thick post regions has a first thickness and the narrow fin region has a second thickness, with the second thickness being less than the first thickness. Gate dielectric material is along sidewalls of the first and second thick post regions, along a top of the narrow fin region, and along side surfaces of the narrow fin region. Gate material is over the gate dielectric material. The gate material extends along the sidewalls of the first and second thick post regions, the top surface of the narrow fin region and the side surfaces of the narrow fin region. A first source/drain region is within the first thick post region. A second source/drain region is within the second thick post region. The semiconductor material is between a first insulative material panel and a second insulative material panel. The first insulative material panel has a first trench extending downwardly therein, and the second insulative material panel having a second trench extending downwardly therein. The first and second insulative material panels have downwardly-extending edges along sides of the first and second trenches. The thick post regions are inset from the downwardly-extending edges of the first and second insulative material panels.

Some embodiments include a transistor having a semiconductor material panel between a first insulative material panel and a second insulative material panel. The first insulative material panel has a first trench extending downwardly therein and the second insulative material panel has a second trench extending downwardly therein. The semiconductor material has a first post region, and a second post region. The semiconductor material comprises a fin region which extends between the first and second post regions. Each of the first and second post regions has a first thickness and the fin region has a second thickness, with the second thickness being less than the first thickness. The fin region comprises a lower part and an upper part that protrudes from the lower part. At least one of a pair of side surfaces of the fin region is substantially uneven at a connection portion between the lower part and the upper part. Gate dielectric material is along sidewalls of the first and second post regions, along a top of the fin region, and along the side surfaces of the fin region. Gate material is over the gate dielectric material and extends along the sidewalls of the first and second post regions, the top surface of the fin region and the side surfaces of the fin region. A first source/drain region is within the first post region. A second source/drain region is within the second post region.

Some embodiments include a memory array having a plurality of transistors. Each transistor includes a narrow fin region of semiconductor material extending between two thick post regions of the semiconductor material. Each of the thick post regions has a first thickness and the narrow fin region has a second thickness, with the second thickness being no more than about 20% of the first thickness. Gate dielectric material is along sidewalls of the first and second thick post regions, along a top of the narrow fin region, and along side surfaces of the narrow fin region. The side surfaces of the narrow fin region are along a first plane and the sidewalls of the first and second thick post regions are along a second plane that intersects the first plane. Gate material is over the gate dielectric material and extends along the sidewalls of the first and second thick post regions, the top surface of the narrow fin region and the side surfaces of the narrow fin region. The gate material is electrically coupled with wordlines. Source/drain regions are within the first and second thick post regions. Pairs of adjacent transistors share source/drain regions. The shared source/drain regions are connected to bitlines. The adjacent transistors also have source/drain regions which are not shared, and which are connected to charge-storage structures In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A transistor, comprising:
a semiconductor material panel between a first insulative material panel and a second insulative material panel; the first insulative material panel having a first trench extending downwardly therein and the second insulative material panel having a second trench extending downwardly therein;
the semiconductor material comprising a first post region and a second post region; the semiconductor material further comprising a fin region extending between the first and second post regions; each of the first and second post regions having a first thickness and the fin region having a second thickness, with the second thickness being less than the first thickness, the fin region comprising a lower part and an upper part that protrudes from the lower part, at least one of a pair of side surfaces of the fin region being substantially uneven at a connection portion between the lower part and the upper part;
gate dielectric material along sidewalls of the first and second post regions, along a top surface of the fin region, and along the side surfaces of the fin region;
gate material along the sidewalls of the first and second post regions, the top surface of the fin region and the side surfaces of the fin region;
a first source/drain region within the first post region; and
a second source/drain region within the second post region.

2. The transistor of claim 1 wherein the side surfaces of the fin region are along a first plane, and the sidewalls of the first and second post regions are along a second plane that intersects the first plane.

3. The transistor of claim 2 wherein the second plane is substantially orthogonal to the first plane.

4. The transistor of claim 1 wherein the second thickness is no more than about 40% of the first thickness.

5. A transistor, comprising:
a semiconductor material panel between a first insulative material panel and a second insulative material panel; the first insulative material panel having a first trench extending downwardly therein and the second insulative material panel having a second trench extending downwardly therein;
the semiconductor material comprising a first post region and a second post region; the semiconductor material further comprising a fin region extending between the first and second post regions; each of the first and second post regions having a first thickness and the fin region having a second thickness, with the second thickness being less than the first thickness, the fin region comprising a lower part and an upper part that protrudes from the lower part, at least one of a pair of side surfaces of the fin region being substantially uneven at a connection portion between the lower part and the upper part;
gate dielectric material along sidewalls of the first and second post regions, along a top surface of the fin region, and along the side surfaces of the fin region;
gate material along the sidewalls of the first and second post regions, the top surface of the fin region and the side surfaces of the fin region;
a first source/drain region within the first post region;
a second source/drain region within the second post region; and
wherein the first and second insulative material panels have downwardly-extending edges along sides of the first and second trenches, and wherein the first and second post regions are inset from the downwardly-extending edges of the first and second insulative material panels by a distance of at least about 2 nm.

6. The transistor of claim 5 wherein the second thickness is within a range of from about 2 nm to about 20 nm; and wherein the first thickness is within a range of from about 5 nm to about 50 nm.

7. A transistor, comprising:
a semiconductor material panel between a first insulative material panel and a second insulative material panel; the first insulative material panel having a first trench extending downwardly therein and the second insulative material panel having a second trench extending downwardly therein;

the semiconductor material comprising a first post region and a second post region; the semiconductor material further comprising a fin region extending between the first and second post regions; each of the first and second post regions having a first thickness and the fin region having a second thickness, with the second thickness being less than the first thickness, the fin region comprising a lower part and an upper part that protrudes from the lower part, at least one of a pair of side surfaces of the fin region being substantially uneven at a connection portion between the lower part and the upper part;

gate dielectric material along sidewalls of the first and second post regions, along a top surface of the fin region, and along the side surfaces of the fin region;

gate material along the sidewalls of the first and second post regions, the top surface of the fin region and the side surfaces of the fin region;

a first source/drain region within the first post region;

a second source/drain region within the second post region; and wherein the first and second insulative material panels have downwardly-extending edges along sides of the first and second trenches, and wherein the first and second post regions are inset from the downwardly-extending edges of the first and second insulative material panels by a first inset distance that is along edges of the first and second post regions above the fin region, and wherein edges of the first and second post regions adjacent the fin region are inset from the downwardly-extending edges of the first and second insulative material panels by a second inset distance; the second inset distance being less than the first inset distance.

* * * * *